(12) United States Patent
Osaka

(10) Patent No.: US 7,843,645 B2
(45) Date of Patent: Nov. 30, 2010

(54) PROJECTION OPTICAL SYSTEM, EXPOSURE APPARATUS, AND METHOD OF MANUFACTURING DEVICE

(75) Inventor: Noboru Osaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 12/233,071

(22) Filed: Sep. 18, 2008

(65) Prior Publication Data

US 2009/0097134 A1    Apr. 16, 2009

(30) Foreign Application Priority Data

Sep. 27, 2007    (JP)    .............. 2007-252379

(51) Int. Cl.
*G02B 3/00*    (2006.01)
*G02B 9/00*    (2006.01)
*G03B 27/54*    (2006.01)

(52) U.S. Cl. .......................... 359/649; 355/67
(58) Field of Classification Search ................ 359/649, 359/708, 719, 497; 355/53, 67
See application file for complete search history.

(56) References Cited

U.S. PATENT DOCUMENTS

| | | | |
|---|---|---|---|
| 6,813,070 B2 * | 11/2004 | Oyama | ....................... 359/361 |
| 7,057,708 B2 | 6/2006 | Yamada | |
| 2006/0055834 A1 | 3/2006 | Tanitsu et al. | |
| 2006/0198029 A1 | 9/2006 | Schuster | |
| 2008/0043331 A1 | 2/2008 | Kraehmer et al. | |
| 2008/0084546 A1 | 4/2008 | Owa et al. | |
| 2008/0212058 A1 * | 9/2008 | Yamada | ....................... 355/67 |

FOREIGN PATENT DOCUMENTS

| | | |
|---|---|---|
| JP | 05-109601 A | 4/1993 |
| JP | 07-142338 A | 6/1995 |
| JP | 2004-045692 A | 2/2004 |
| JP | 2006-113533 A | 4/2006 |
| WO | 2004/051717 A1 | 6/2004 |

* cited by examiner

*Primary Examiner*—Alicia M Harrington
(74) *Attorney, Agent, or Firm*—Canon U.S.A. Inc., I.P Division

(57) ABSTRACT

This invention is a projection optical system which includes a plurality of lens groups and projects an image of a first object onto a second object. A bottom lens group of the plurality of lens groups which is positioned nearest to the second object is made of an isotropic crystal material having a refractive index of 1.6 or more and has a positive focal length. A curvature radius R (mm) of a surface of the bottom lens group which is located on the first object side and a center thickness d (mm) of the bottom lens group satisfy $3.0 > R/d > 1.6$ and $d < 60$.

5 Claims, 11 Drawing Sheets

PROJECTION OPTICAL SYSTEM, EXPOSURE APPARATUS, AND METHOD OF MANUFACTURING DEVICE

BACKGROUND OF THE INVENTION

1. Field of the Invention

The present invention relates to a projection optical system, an exposure apparatus, and a method of manufacturing a device.

2. Description of the Related Art

A projection exposure apparatus is used in a lithography process in a semiconductor device manufacturing process. The lithography process is the process of projecting and transferring a circuit pattern of a semiconductor device onto a substrate (called a silicon substrate, glass substrate, wafer, or the like) to be formed into a semiconductor device. Recently, with advances in the miniaturization of semiconductor devices, patterns with line widths of 0.15 μm or less have been transferred. Decreasing the sizes of semiconductor devices can increase the integration degrees of semiconductor devices and manufacture low-power, high-performance devices. The demand for further decreases in the sizes of semiconductor devices is high. This also increases the demand for increases in the resolving power of projection exposure apparatuses.

According to the Rayleigh expression, a resolving power RP, a wavelength λ of exposure light, and the NA of a projection exposure apparatus satisfy the following relational expression. In the following description, NA represents the numerical aperture of a projection optical system unless otherwise specified.

$$RP = k_1 \cdot \lambda / NA$$

where $k_1$ is a proportionality constant.

As indicated by the Rayleigh expression, as a method of increasing the resolving power of a projection exposure apparatus, a method of increasing the NA of a projection optical system and decreasing the wavelength of exposure light is available. There has recently been an increasing tendency toward an increase in the NA of a projection optical system and a decrease in the wavelength of exposure light. In the tendency toward shorter wavelength of exposure light, for example, a KrF excimer laser (wavelength: 248 nm) has been used for exposure, and an ArF excimer laser (wavelength: 193 nm) has also been used as a light source for critical layer exposure.

With an increase in NA, polarized light needs to be used for an illumination optical system. The detailed arrangement of a polarized illumination is disclosed in the pamphlet of International Publication WO 2004/051717, Japanese Patent Laid-Open No. 05-109601, and the like.

The glass materials used for projection optical systems using lasers having wavelengths in a high-energy exposure light wavelength range of 300 nm or less have been limited to $SiO_2$ (to be referred to as quartz hereinafter) and $CaF_2$ (to be referred to as fluorite hereinafter).

In order to increase the NA, an immersion exposure technique is used. This technique achieves an NA of 1.0 or more by using quartz as a glass material for a projection lens and filling the space between the bottom lens group of a projection system and a wafer with a liquid having a higher refractive index than air. In this specification, the "bottom lens group" means lenses or a cemented lens, of the lenses of a projection optical system, which is located nearest to a wafer and in contact with an immersion liquid. The "cemented lens" means a lens obtained by cementing a plurality of lenses. Pure water having a refractive index of 1.44 is to be currently used as an immersion liquid. Using pure water as an immersion liquid can increase the NA of the projection system up to an NA of 1.44 theoretically and up to about 1.3 constructionally.

In order to further increase the NA, there have been proposed a technique of using a liquid having a higher refractive index than pure water as an immersion liquid and a technique of using a glass material having a higher refractive index than quartz for the bottom lens group of a projection optical system. It is expected to increase the structural NA to about 1.4 by using a liquid having a higher refractive index than pure water as an immersion liquid and increase the NA to about 1.65 by using a glass material having a higher refractive index than quartz for the bottom lens group of the projection optical system. A medium having a refractive index of about 1.8 has been thought as a liquid having a higher refractive index than pure water. However, there has been no explicit description about the details of such a medium, for example, its composition and physical properties other than the refractive index.

U.S. Pre-Grant Publication No. 2006/0198029 discloses an example which limits an illumination condition to tangential polarized light and uses a uniaxial crystal such as $Al_2O_3$ as a glass material having a higher refractive index than quartz. However, for example, the practical use of uniaxial crystals cannot be expected, and the illumination condition is limited. This makes this technique impractical.

As a glass material having a higher refractive index than quartz, $Lu_3Al_5O_{12}$ (to be referred to LuAG hereinafter) having a refractive index of 2.14 is currently in the spotlight.

Quartz which is generally used as a glass material for a projection optical system using an ArF excimer laser has no structural directivity. For this reason, no intrinsic birefringence originating from the crystal structure is observed, and only birefringences observed are a stress birefringence at the time of processing and a birefringence due to a residual stress caused by an annealing temperature distribution in a manufacturing process or the like. The magnitudes of these birefringences are about 1 nm/cm or less per lens in terms of pv value, and tend to decrease owing to manufacturing and processing techniques. In contrast, fluorite or LuAG as a crystal glass material has a birefringence originating from its crystal structure. The magnitudes of the birefringences of fluorite and LuAG are respectively 3.4 nm/cm and about 30 nm/cm at maximum.

FIG. 1 shows a birefringence distribution obtained when the <1, 1, 1> crystal axis of a crystal structure indicated by the isotropic crystal material of a flat plate is oriented in a direction perpendicular to the drawing surface, and a birefringence distribution obtained when the <1, 0, 0> crystal axis is oriented in a direction perpendicular to the drawing surface. Referring to FIG. 1, the angle at which a light beam passes through is the radial direction, and the position at which the light beam passes is expressed by an angle of deviation. Referring to FIG. 1, the length of each short line represents a relative birefringence amount, and the direction represents the direction of an axis along which the birefringence moves.

Referring to FIG. 1, the birefringence is 0 in the <1, 1, 1> crystal axis direction and the <1, 0, 0> crystal axis direction, and exhibits the maximum value in the <1, 1, 0> crystal axis direction. It is a challenge for an exposure apparatus to solve the problem of birefringences originating from this crystal structure. As described above, these crystal glass materials are often used for the bottom lens group of a projection lens because of their structures. In addition, in general, the R2 surface (on the wafer surface side) of a bottom lens group is flat or has a large curvature to allow easy control of a liquid.

FIG. 2 plainly shows part of a projection optical system. Reference numeral 100 denotes a state in which light passing through the bottom lens group of the projection optical system and an immersion liquid forms an image on a wafer surface; 110, a bottom lens group; 120, an immersion liquid; and 130, a wafer surface. Reference symbol OA denotes an optic axis; O, a point at which the optic axis OA intersects the wafer surface 130; and P, a point on the wafer surface which is spaced apart from the point O by Xi. Light beams 10, 11, and 12 reach the point O. Reference numeral 11 denotes the principal ray; and 10 and 12, the light beams reaching the point O on the wafer surface at an incident angle θ. Light beams 20, 21, and 22 reach the point P. Reference numeral 21 denotes the principal ray; and 20 and 22, the light beams reaching the point P on the wafer surface at the incident angle θ.

The incident angle θ is expressed by the following relational expression by using an NA and a refractive index Ni of an immersion liquid.

$$NA = Ni \sin\theta$$

When, therefore, the <1, 1, 1> and <1, 0, 0> crystal axes in FIG. 1 are oriented to the optic axis, as the NA increases, the birefringence originating from a crystal structure has a larger influence.

When a glass material having a refractive index of 2.0 or more, for example, LuAG, is used for the bottom lens group of a projection optical system, it is necessary to correct a birefringence (to be referred to as an intrinsic birefringence or IBR) originating from the crystallinity of the glass material. Techniques of correcting birefringences are disclosed in Japanese Patent Laid-Open Nos. 2006-113533 and 2004-45692.

The technique disclosed in Japanese Patent Laid-Open No. 2006-113533 corrects birefringences by using a physical property that when calcium oxide or magnesium oxide is used for a bottom lens group and its adjacent lens group, birefringences originating from crystal structures exhibit opposite signs between the glass materials. However, since the transmittance of such a material is low, and the IBR of calcium oxide is equal to or more than 300 nm/cm, the correction residue increases. For this reason, this technique is not practical.

Japanese Patent Laid-Open Nos. 2006-113533 and 2004-45692 disclose methods of orienting the <1, 0, 0> and <1, 1, 1> crystal axes to the optic axis of the projection optical system.

SUMMARY OF THE INVENTION

It is an object of the present invention to provide a projection optical system in which even if a glass material having a birefringence originating from its crystal structure is used for a bottom lens group, the adverse effect of the birefringence on optical performance is reduced, and good birefringence uniformity between image heights and high resolving power are obtained.

According to a first aspect of the present invention, there is provided a projection optical system which includes a plurality of lens groups and projects an image of a first object onto a second object, wherein a bottom lens group of the plurality of lens groups which is positioned nearest to the second object comprises an isotropic crystal material having a refractive index of not less than 1.6 and has a positive focal length, and wherein a curvature radius R (mm) of a surface of the bottom lens group which is located on the first object side and a center thickness d (mm) of the bottom lens group satisfy 3.0>R/d>1.6 and d<60.

According to a second aspect of the present invention, there is provided an exposure apparatus which comprises a projection optical system configured to include a plurality of lens groups and to project an image of an original onto a substrate and exposes the substrate to light via the original and the projection optical system, wherein a bottom lens group of the plurality of lens groups which is positioned nearest to the second object comprises an isotropic crystal material having a refractive index of not less than 1.6 and has a positive focal length, and wherein a curvature radius R (mm) of a surface of the bottom lens group which is located on the first object side and a center thickness d (mm) of the bottom lens group satisfy 3.0>R/d>1.6 and d<60.

According to a third aspect of the present invention, there is provided a method of manufacturing a device, the method comprising: exposing a substrate by using an exposure apparatus; developing the exposed substrate; and processing the developed substrate, wherein the exposure apparatus comprises a projection optical system configured to include a plurality of lens groups and to project an image of an original onto a substrate and exposes the substrate to light via the original and the projection optical system, wherein a bottom lens group of the plurality of lens groups which is positioned nearest to the second object comprises an isotropic crystal material having a refractive index of not less than 1.6 and has a positive focal length, and wherein a curvature radius R (mm) of a surface of the bottom lens group which is located on the first object side and a center thickness d (mm) of the bottom lens group satisfy 3.0>R/d>1.6 and d<60.

The present invention can provide a projection optical system in which even if a glass material having a birefringence originating from its crystal structure is used for a bottom lens group, the adverse effect of the birefringence on optical performance is reduced, and good birefringence uniformity between image heights and high resolving power are obtained.

Further features of the present invention will become apparent from the following description of exemplary embodiments with reference to the attached drawings.

DESCRIPTION OF THE EMBODIMENTS

Embodiment of Projection Optical System

Figure 1:
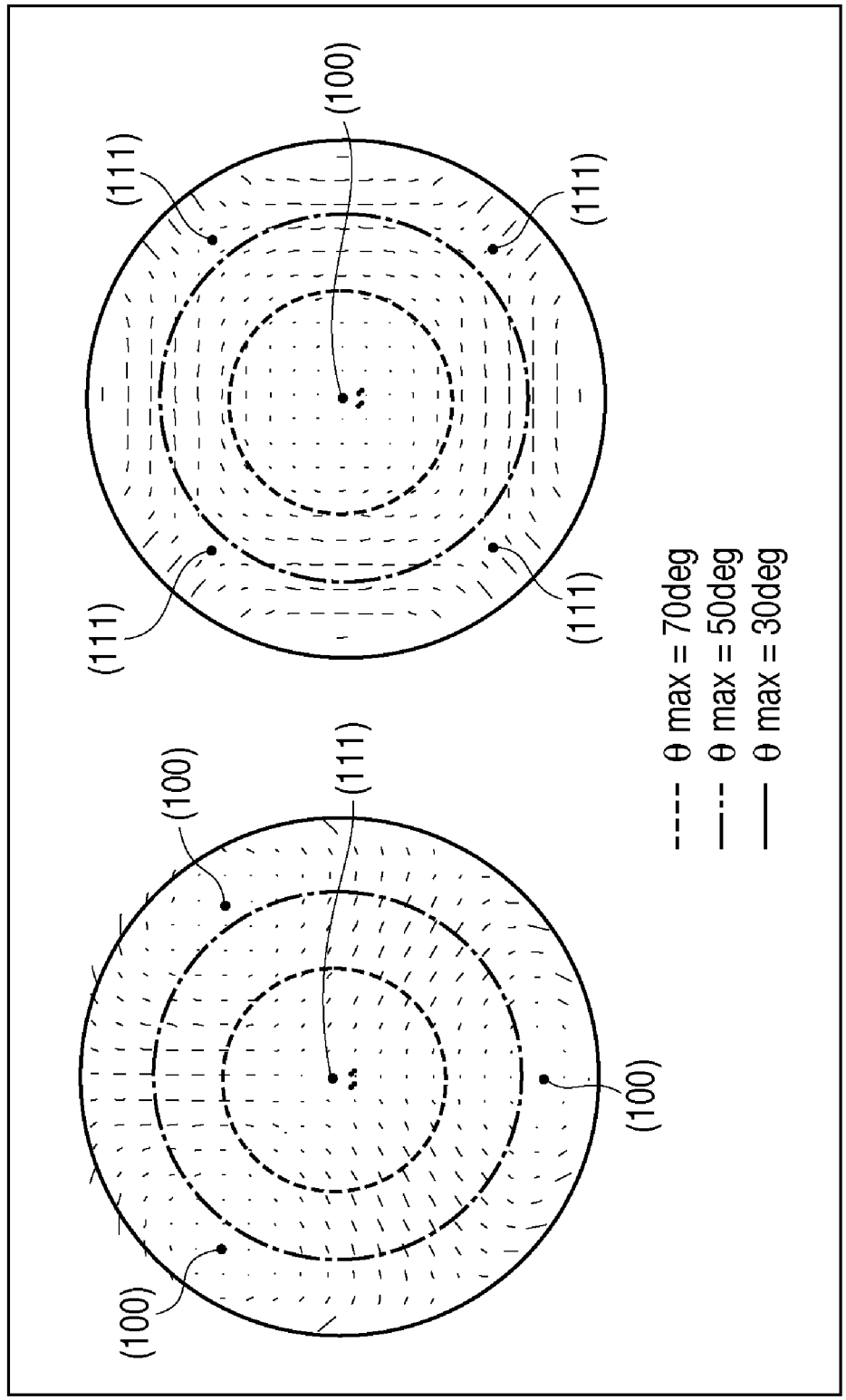
FIG. 1 is a view showing birefringence distributions originating from the crystal structure of the isotropic crystal material of a flat plate.
Figure 2:
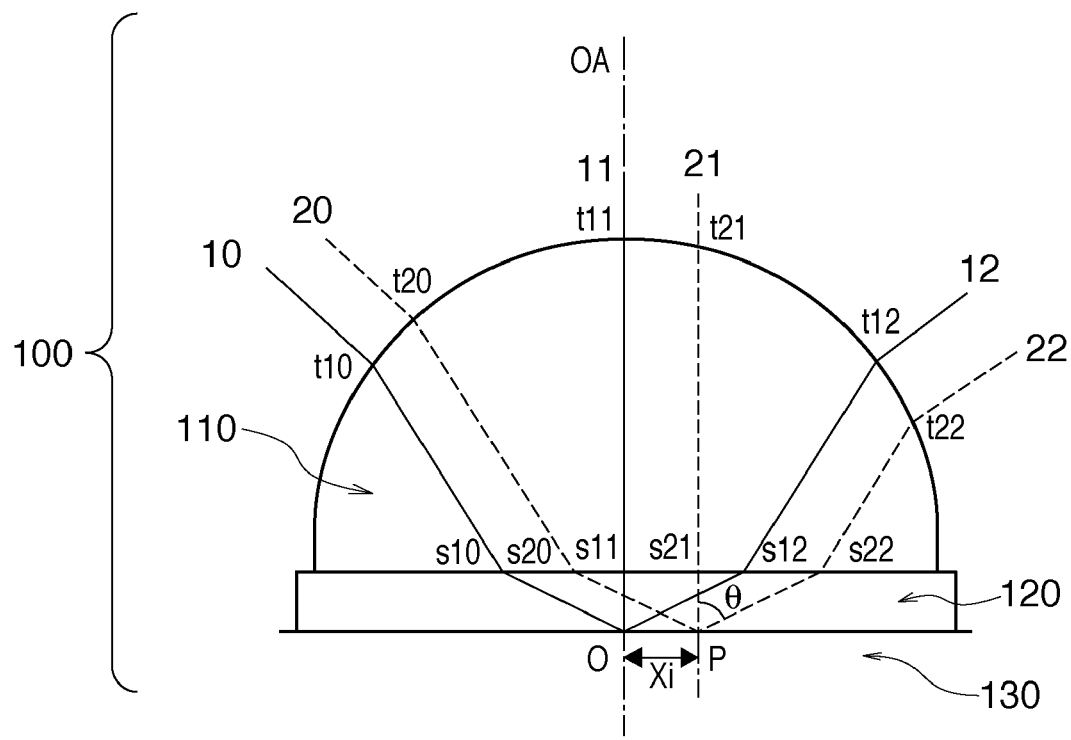
FIG. 2 is a view showing part of a projection optical system.

The principle of the present invention will be described with reference to FIG. 2. Light beams 10, 11, and 12 which form images at a point O are compared with light beams 20, 21, and 22 which form images at a point P. Letting C1 be the distance by which the principal ray 11 of light which forms an image at the point O passes through a bottom lens group 110, the distance C1 is represented by the length of a line segment connecting t11 and s11. The bottom lens group 110 is the lens group, of a plurality of lens groups included in a projection optical system which projects an image of a first object onto a second object, which is positioned nearest to the second object. In this embodiment, the first object is a reticle as an original, and the second object is a wafer as a substrate.

Letting L1 and R1 be the distances by which the marginal rays 10 and 12 of light which form images at the point O pass through the bottom lens group 110, the distances L1 and R1 are represented by the length of a line segment connecting t10 and s10 and the length of a line segment connecting t12 and s12, respectively. Letting C2 be the distance by which the principal ray 21 of light which forms an image at the point P passes through the bottom lens group 110, the distance C2 is represented by the length of a line segment connecting t21 and s21. In addition, letting L2 and R2 be the distances by which the marginal rays 20 and 22 of light which form images at the point P pass through the bottom lens group 110, the distances L2 and R2 are represented by the length of a line segment connecting t20 and s20 and the length of a line segment connecting t22 and s22, respectively.

Since the distances C1, L1, and R1 or C2, L2, and R2 are different from each other, birefringences in the pupil have a distribution within a given image height. If the bottom lens group 110 is a sufficiently thin convex lens having a thickness of about 3 mm, the birefringences generated at C1, L1, and R1 are 3 nm or less with LuAG. This value corresponds to 50 mλ or less, which is sufficiently small, when the wavelength of exposure light is 193.3 nm.

The shape of a bottom lens group to be actually used is assumed to have a thickness of 20 mm or more in consideration of total reflection conditions and other shape restrictions on the R1 surface (on the reticle side) of the bottom lens group. If the thickness of the bottom lens group is about 60 mm or less, birefringences in the pupil within a given image height can be corrected by a method using, as a bottom lens group, a cemented lens obtained by cementing a plurality of lenses.

REFERENCE EXAMPLE

Figure 3:
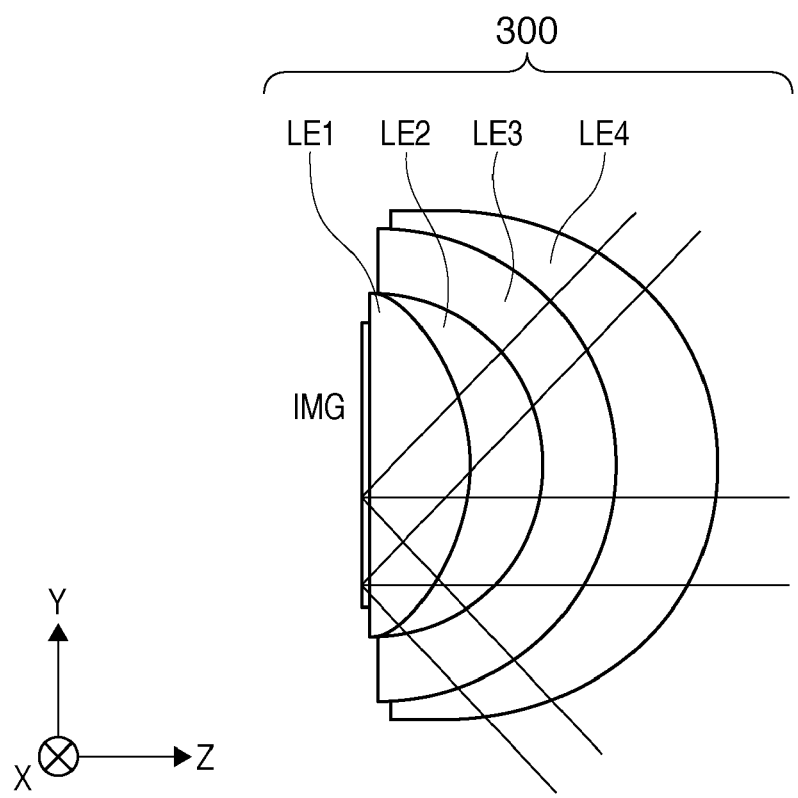
FIG. 3 is a sectional view of the bottom lens group of the projection optical system.

Consider, for example, a bottom lens group 300 which is a cemented lens obtained by cementing four lenses, with Table 1 showing the shape of the bottom lens group and FIG. 3 showing a sectional view of the bottom lens group. Center thickness d=47.4 (mm) of the bottom lens group 300 is the total center thickness (mm) of the cemented lens. As shown in FIG. 3, the bottom lens group 300 is positioned in a right-handed coordinate system.

TABLE 1

NA = 1.55
Maximum Image Height = 65.75 mm
R/d = 0.735

| Surface Number | Curvature Radius | Surface Interval | Material | Crystal Axis | Figure Number |
|---|---|---|---|---|---|
| Second Object Surface | ∞ | 1 | liquid A | — | IMG |
| 1 | 0 | 13.81629 | LuAG | <1, 1, 1> | LE1 |
| 2 | 29.77052 | 10.00306 | LuAG | <1, 0, 0> | LE2 |
| 3 | 23.74367 | 9.99596 | LuAG | <1, 1, 1> | LE3 |
| 4 | 32.3855 | 13.59572 | LuAG | <1, 0, 0> | LE4 |
| 5 | 34.85083 | — | | | |

Reference symbol IMG denotes a second object surface (wafer surface). Lenses LE1 to LE4 have the shapes indicated by Table 1. The space between the IMG and the first surface is filled with a liquid A having a refractive index of 1.8, which corresponds to image heights of 18.2 mm to 65.75 mm. The surface numbers in the first column are arranged along a direction opposite to the traveling direction of light from the IMG, the curvature radii in the second column correspond to the surface number, the third column represents the surface intervals (intervals on the axis), and the fourth and fifth columns respectively represent materials and the crystal axis azimuths of the glass materials oriented in the direction of an optical axis (Z-axis).

Figure 4:
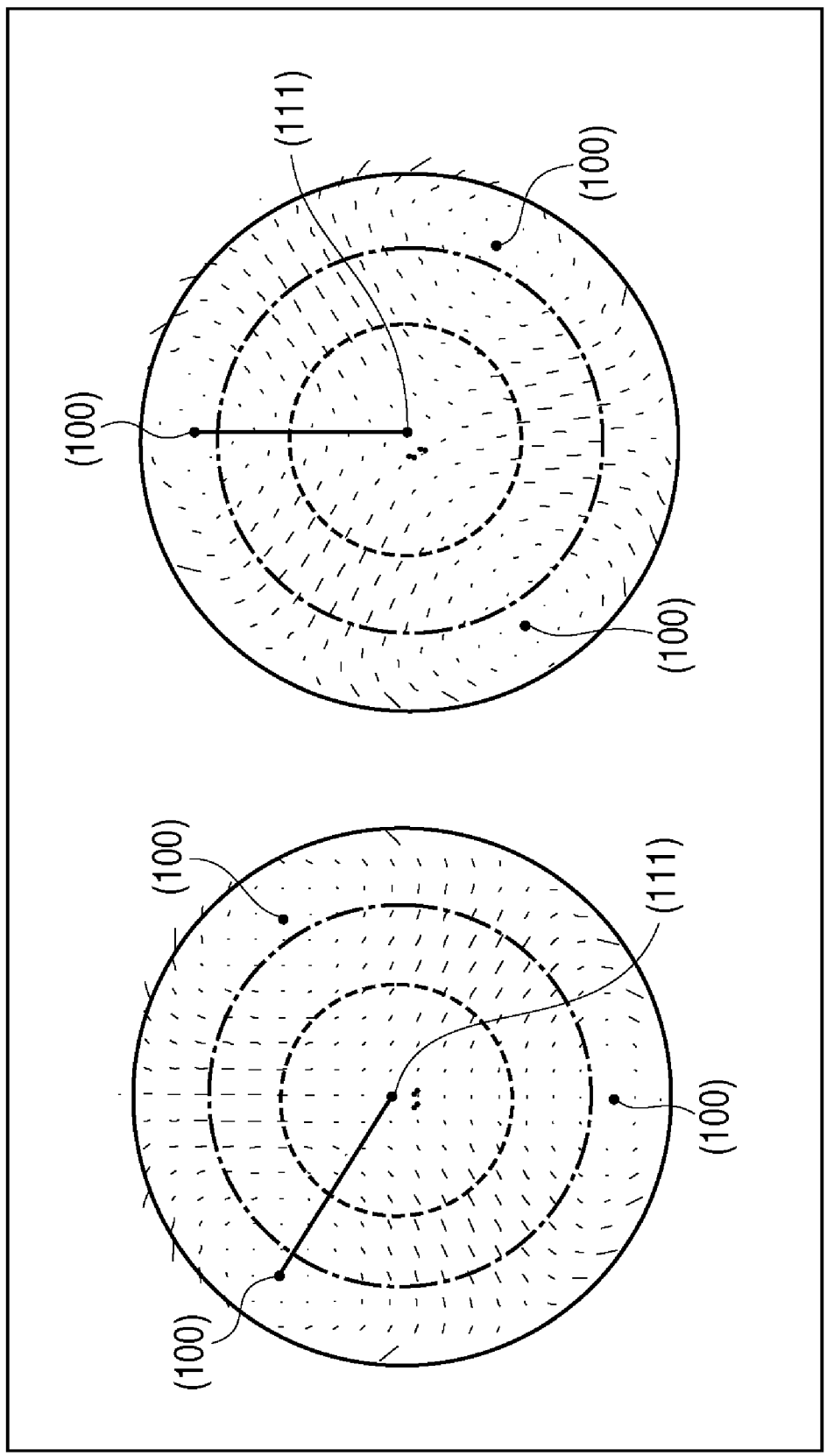
FIG. 4 is a view showing the birefringence distributions of the first and third lenses of the bottom lens group.

LE1 to LE4 are made of LuAG (refractive index: 2.14) as a crystal glass material. Each lens is designed to reduce birefringences in the bottom lens group 300 by clocking operation as described later. The crystal axes <1, 1, 1> of LE1 and LE3 are both oriented in the Z-axis direction, but the <1, 0, 0> axes are configured such that projective lines of the <1, 0, 0> axes on a plane perpendicular to the optical axis form a relative angle of 60°, as shown in FIG. 4. Likewise, the crystal axes <1, 0, 0> of LE2 and LE4 are both oriented in the Z-axis direction, but the <1, 1, 1> axes are configured such that projective lines of the <1, 1, 1> axes on a plane perpendicular to the optical axis form a relative angle of 45°.

Figure 5A:
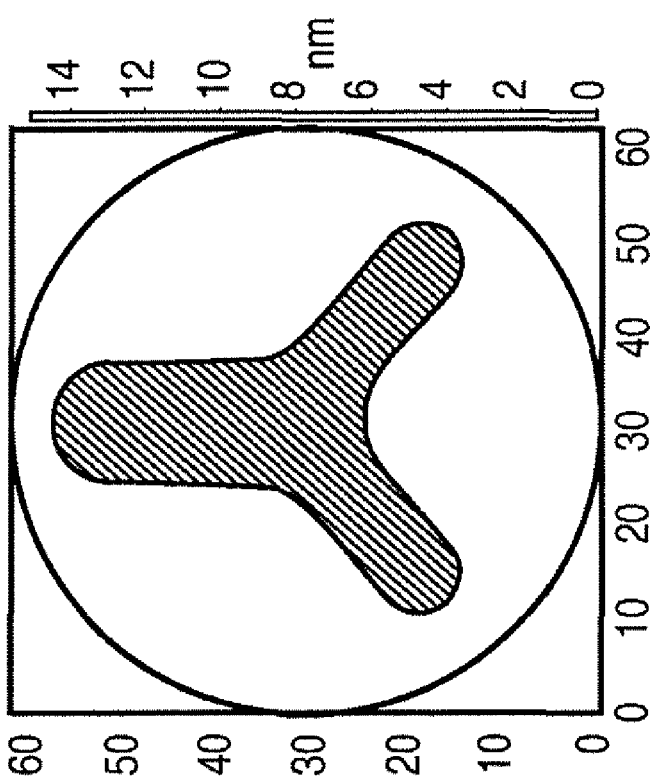
FIGS. 5A and 5B are views each showing the retardation distribution caused in the pupil by the bottom lens group.
Figure 5B:
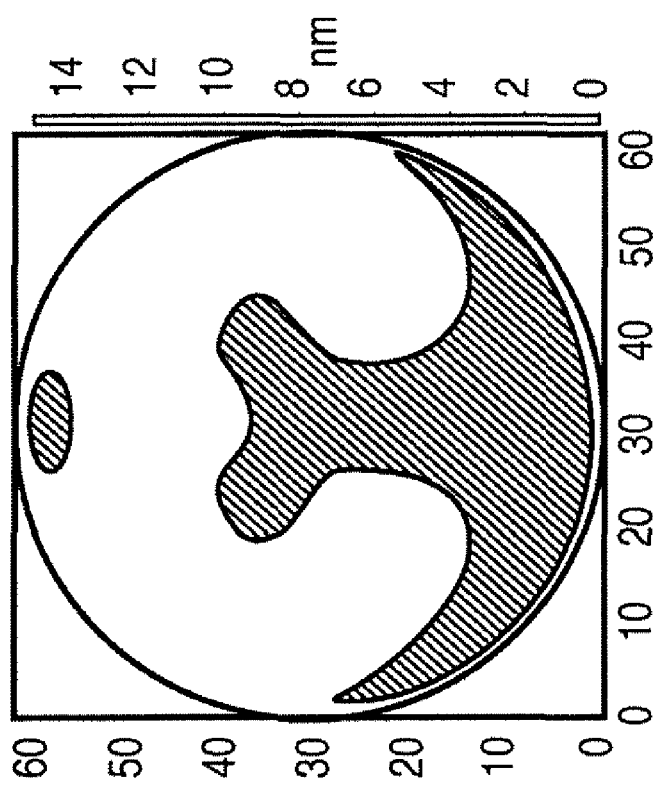

FIGS. 5A and 5B each show a retardation distribution generated by the bottom lens group 300. FIG. 5A shows the retardation distribution in the pupil at the slit center (corresponding to 4.55 mm on the IMG). FIG. 5B shows the retardation distribution in the pupil at a slit end (corresponding to 16.4375 mm on the IMG). A retardation RMS in the pupil at the slit center is corrected to 45.1 mλ, and the retardation RMS in the pupil at the slit end is corrected to 32.6 mλ.

As described above, if the total thickness of the bottom lens group is about 60 mm or less, it is possible to correct birefringences within one image height. As is obvious from FIGS. 5A and 5B, however, the tendency of a retardation distribution greatly differs between image heights. The retardation RMS obtained by calculating the differences between retardations at the respective points on the pupil at the slit center and the slit ends was 22.3 mλ, which represents retardation uniformity between image heights.

If the retardation uniformity between image heights is low, the CD uniformity performance of the exposure apparatus deteriorates. The retardation uniformity between image heights is preferably 10 mλ or less, and more preferably 5 mλ or less. The present invention has therefore been configured to improve the retardation uniformity between image heights by minimizing retardation differences due to the length differences between C1 and C2, L1 and L2, and R1 and R2 in FIG. 2.

Concrete examples of a bottom lens group which can be used for the projection optical system according to the present invention will be described below.

EXAMPLE 1

Figure 6:
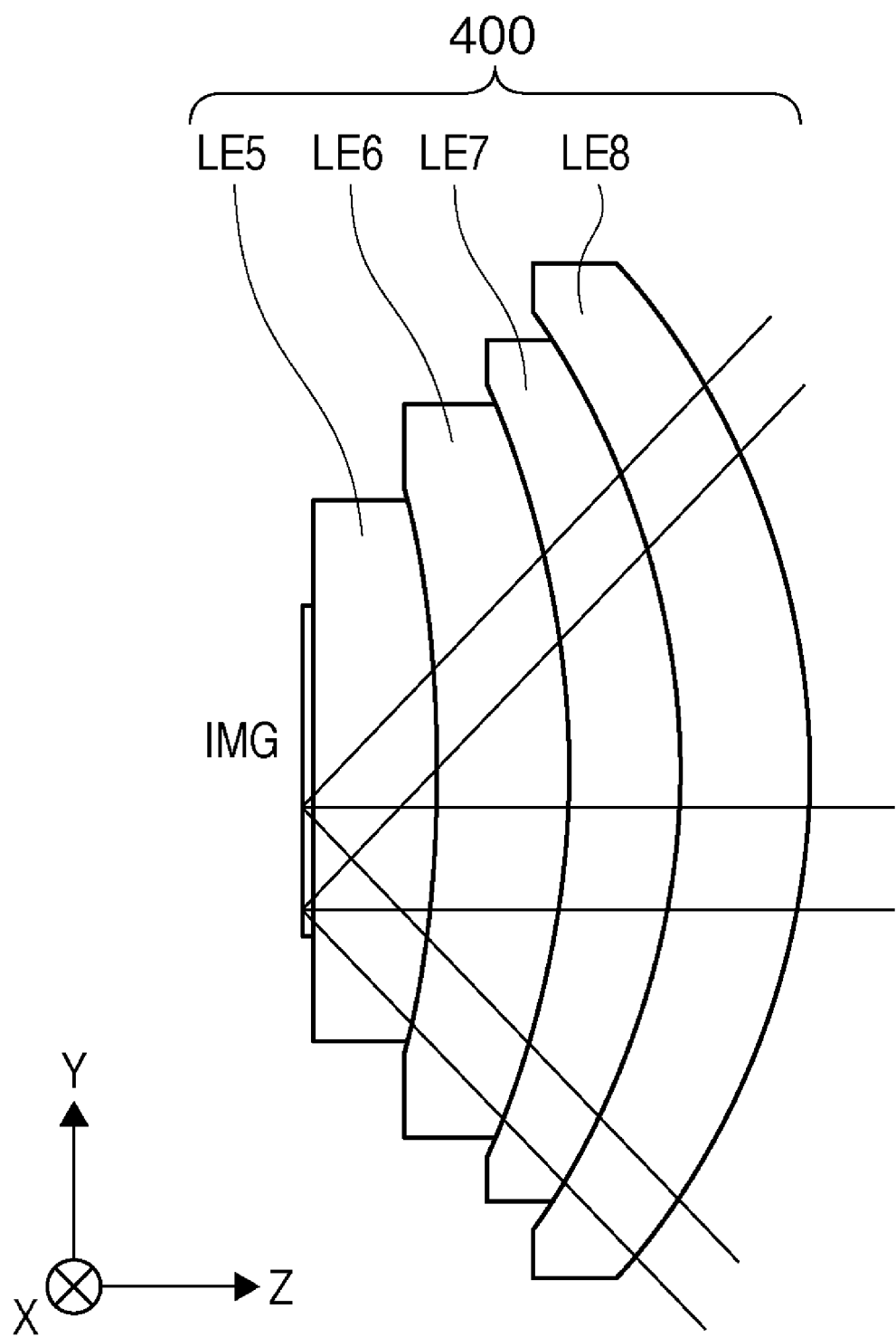
FIG. 6 is a sectional view of a bottom lens in Example 1.

Example 1 of the bottom lens group will be described with reference to FIGS. 6 and 7. FIG. 6 is a sectional view of a bottom lens group 400 obtained by cementing four lenses made of an isotropic crystal material. The bottom lens group 400 is positioned in a right-handed coordinate system. The center thickness of the bottom lens group 400 is the total center thickness of the cemented lens.

TABLE 2

NA = 1.55
Maximum Image Height = 65.75 mm
R/d = 1.55

| Surface Number | Curvature Radius | Surface Interval | Material | Crystal Axis | Figure Number |
|---|---|---|---|---|---|
| Second Object Surface | ∞ | 1 | liquid A | — | IMG |
| 1 | 0 | 14.40963 | LuAG | <1, 1, 1> | LE5 |
| 2 | 150.50389 | 15.42734 | LuAG | <1, 0, 0> | LE6 |
| 3 | 113.89038 | 12.79486 | LuAG | <1, 1, 1> | LE7 |
| 4 | 94.4414 | 15.36816 | LuAG | <1, 0, 0> | LE8 |
| 5 | 90 | — | | | |

Lenses LE5 to LE8 have the shapes indicated by Table 2. The space between the IMG and the first surface is filled with a liquid A having a refractive index of 1.8, which corresponds to image heights of 18.2 mm to 65.75 mm. LE5 to LE8 are made of LuAG (refractive index: 2.14) as a crystal glass material. Each lens is designed to reduce birefringences in the bottom lens group 400 by clocking operation as described later. The crystal axes <1, 1, 1> of LE5 and LE7 are both oriented in the Z-axis direction, but the <1, 0, 0> axes are configured such that projective lines of the <1, 0, 0> axes on a plane perpendicular to the optical axis form a relative angle of 60°, as shown in FIG. 4. Likewise, the crystal axes <1, 0, 0> of LE6 and LE8 are both oriented in the Z-axis direction, but the <1, 1, 1> axes are configured such that projective lines of the <1, 1, 1> axes on a plane perpendicular to the optical axis form a relative angle of 45°.

Figure 7A:
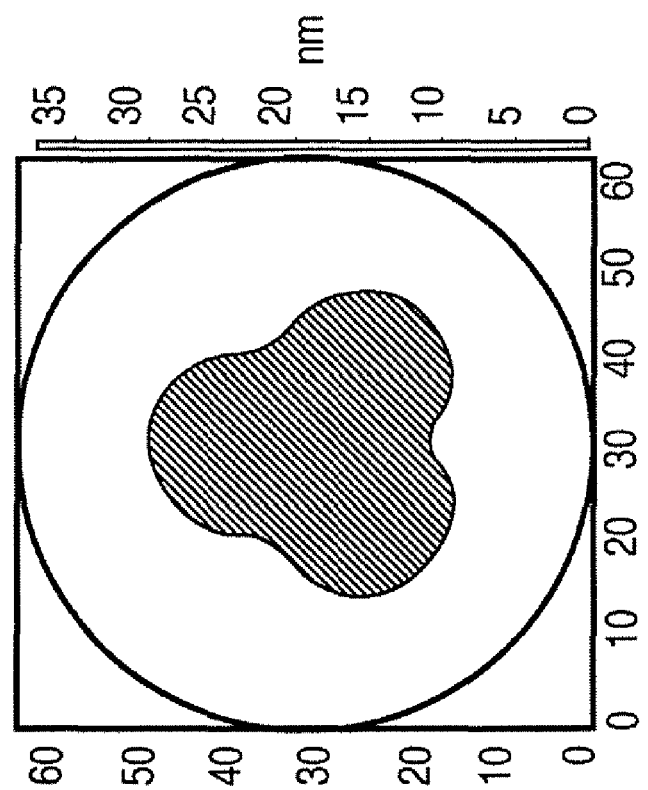
FIGS. 7A and 7B are views each showing the retardation distribution caused in the pupil by the bottom lens in Example 1.
Figure 7B:
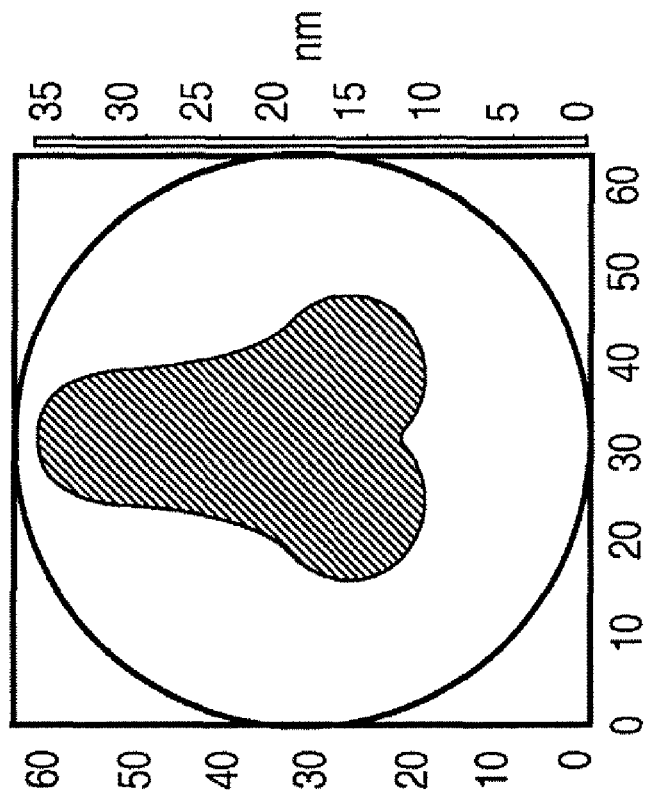

FIGS. 7A and 7B each show the retardation distribution generated by the bottom lens group 400. FIG. 7A shows the retardation distribution in the pupil at the slit center (corresponding to 4.55 mm on the IMG). FIG. 7B shows the retardation distribution in the pupil at the slit end (corresponding to 16.4375 mm on the IMG).

The retardation RMS in the pupil at the slit center is corrected to 88.2 mλ, and the retardation RMS in the pupil at the slit end is corrected to 79.3 mλ. With this arrangement, it is possible to reduce the retardation in the pupil within an image height and improve the imaging performance to a desired level by using a technique of inserting a member for controlling birefringences near the pupil of a projection optical system which is disclosed in, for example, Japanese Patent Laid-Open No. 7-142338.

As is obvious from FIGS. 7A and 7B, the tendencies of the retardation distributions between image heights are the same, which is represented by 8.2 mλ in terms of uniformity between the image heights according to the definition described above. This explicitly indicates the effect of the present invention.

Example 1 has exemplified LuAG as an isotropic crystal material for the lens comprising the liquid having a refractive index of 1.8. However, the type of immersion liquid is not limited, and the isotropic crystal material to be used is not limited to LuAG. The same effects as those described above can be expected even by using another type of isotropic crystal glass material.

EXAMPLE 2

A bottom lens group 500 will be described with reference to FIGS. 8 and 9. The center thickness of the bottom lens group 500 is the total center thickness of the cemented lens.

TABLE 3

NA = 1.55
Maximum Image Height = 65.75 mm
R/d = 2.0

| Surface Number | Curvature Radius | Surface Interval | Material | Crystal Axis | Figure Number |
|---|---|---|---|---|---|
| Second Object Surface | ∞ | 1 | liquid A | — | IMG |
| 1 | ∞ | 12.40956 | LuAG | <1, 1, 1> | LE9 |
| 2 | 238.76105 | 8.42732 | LuAG | <1, 0, 0> | LE10 |
| 3 | 124.2767 | 12.795 | LuAG | <1, 1, 1> | LE11 |
| 4 | 96.98824 | 11.36812 | LuAG | <1, 0, 0> | LE12 |
| 5 | 90 | — | | | |

Figure 8:
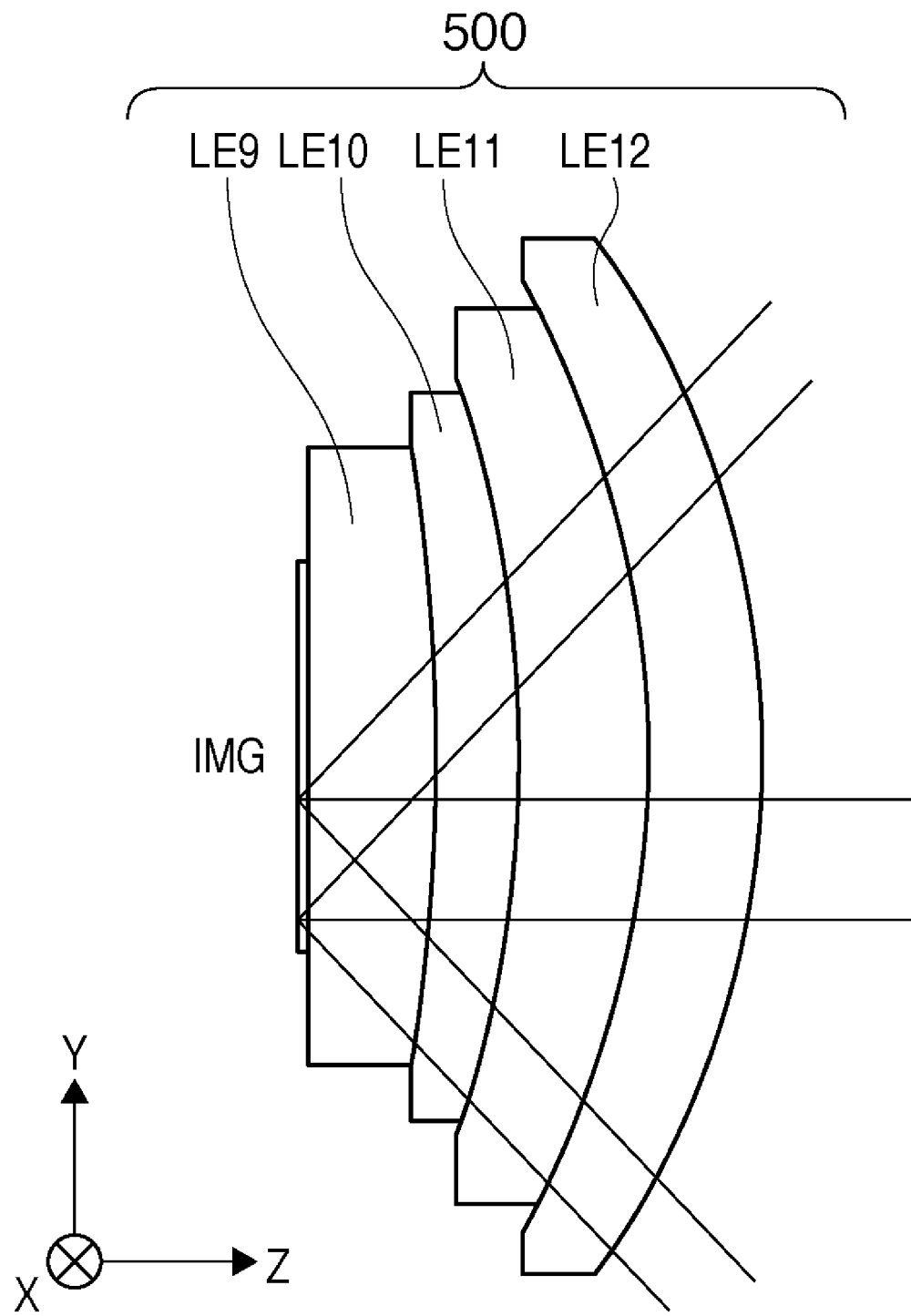
FIG. 8 is a sectional view of a bottom lens in Example 2.

FIG. 8 is a sectional view of the bottom lens group 500, which is positioned in a right-handed coordinate system. Lenses LE9 to LE12 have the shapes indicated by Table 3. The space between the IMG and the first surface is filled with a liquid A having a refractive index of 1.8, which corresponds to image heights of 18.2 mm to 65.75 mm. LE5 to LE8 are made of LuAG (refractive index: 2.14) as a crystal glass material. Each lens is designed to reduce birefringences in the bottom lens group 500 by clocking operation as described later.

The crystal axes <1, 1, 1> of LE9 and LE11 are both oriented in the Z-axis direction, but the <1, 0, 0> axes are configured such that projective lines of the <1, 0, 0> axes on a plane perpendicular to the optical axis form a relative angle of 60°, as shown in FIG. 4. Likewise, the crystal axes <1, 0, 0> of LE10 and LE12 are both oriented in the Z-axis direction, but the <1, 1, 1> axes are configured such that projective lines of the <1, 1, 1> axes on a plane perpendicular to the optical axis form a relative angle of 45°.

Figure 9A:
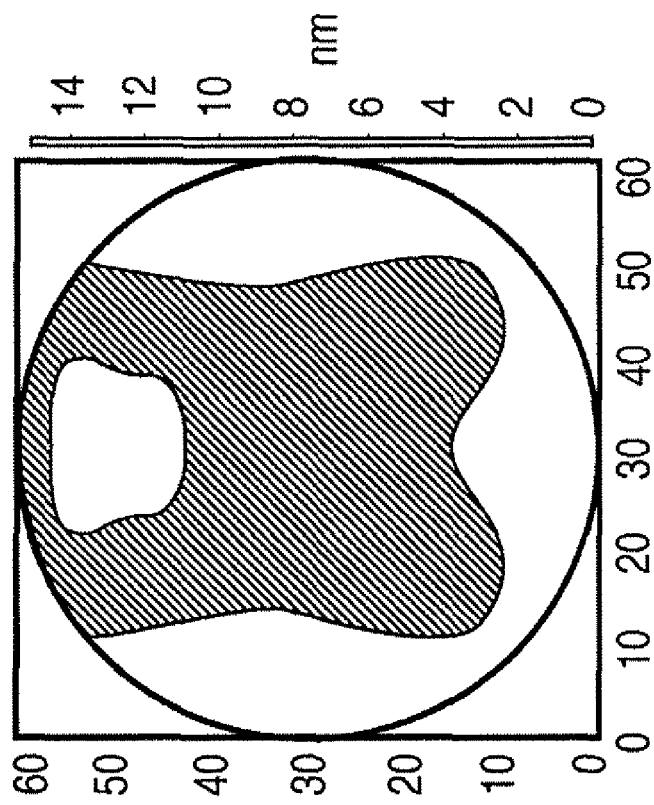
FIGS. 9A and 9B are views each showing the retardation distribution caused in the pupil by the bottom lens in Example 2.
Figure 9B:
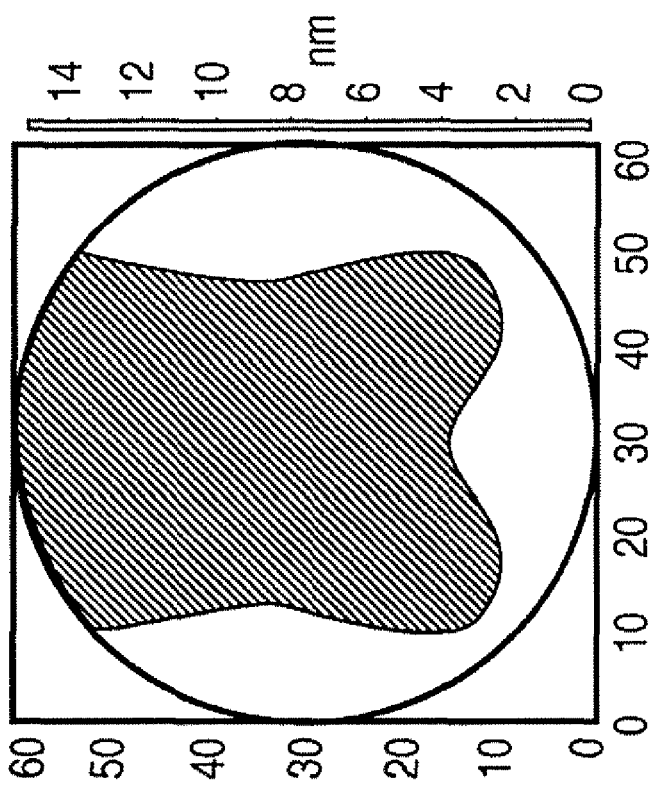

FIGS. 9A and 9B each show the retardation distribution generated by the bottom lens group 500. FIG. 9A shows the retardation distribution in the pupil at the slit center (corresponding to 4.55 mm on the IMG). FIG. 9B shows the retardation distribution in the pupil at the slit end (corresponding to 16.4375 mm on the IMG). The retardation RMS in the pupil at the slit center is corrected to 23.7 mλ, and the retardation RMS in the pupil at the slit end is corrected to 24.8 mλ.

As obvious from FIGS. 9A and 9B, the tendencies of the retardation distributions between image heights are the same, which is represented by 3.8 mλ in terms of uniformity between the image heights according to the definition described above. This explicitly indicates the effect of the present invention.

EXAMPLE 3

Figure 10:
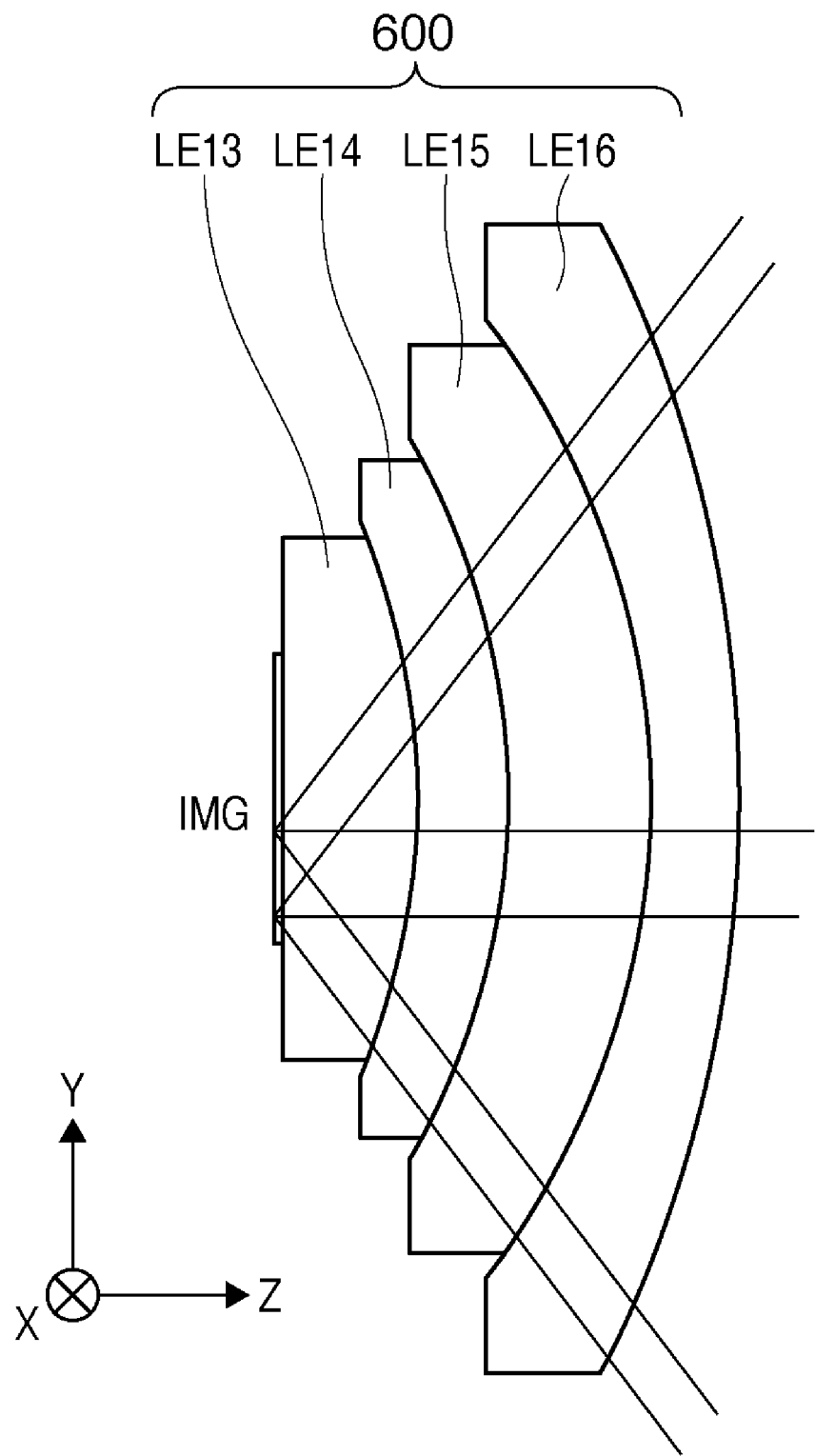
FIG. 10 is a sectional view of a bottom lens in Example 3.

Example 3 of a bottom lens group 600 will be described with reference to FIGS. 10 and 11. The center thickness of the bottom lens group 600 is the total center thickness of the cemented lens. FIG. 10 is a sectional view of the bottom lens group 600, which is positioned in a right-handed coordinate system.

TABLE 4

NA = 1.70
Maximum Image Height = 65.75 mm
R/d = 2.81

| Surface Number | Curvature Radius | Surface Interval | Material | Crystal Axis | Figure Number |
|---|---|---|---|---|---|
| Second Object Surface | ∞ | 1 | liquid A | — | IMG |
| 1 | ∞ | 18.70197 | LuAG | <1, 1, 1> | LE13 |
| 2 | 102.06105 | 12.84887 | LuAG | <1, 0, 0> | LE14 |
| 3 | 100.74898 | 20.08704 | LuAG | <1, 1, 1> | LE15 |
| 4 | 111.64548 | 12.34996 | LuAG | <1, 0, 0> | LE16 |
| 5 | 180 | | | | |

Lenses LE13 to LE16 have the shapes indicated by Table 4. The space between the IMG and the first surface is filled with a liquid A having a refractive index of 1.8, which corresponds to image heights of 18.2 mm to 65.75 mm. LE13 to LE16 are made of LuAG (refractive index: 2.14) as a crystal glass material. Each lens is designed to reduce birefringences in the bottom lens group 600 by clocking operation as described later.

The crystal axes <1, 1, 1> of LE13 and LE15 are both oriented in the Z-axis direction, but the <1, 0, 0> axes are configured such that projective lines of the <1, 0, 0> axes on a plane perpendicular to the optical axis form a relative angle of 60°, as shown in FIG. 4. Likewise, the crystal axes <1, 0, 0> of LE14 and LE16 are both oriented in the Z-axis direction, but the <1, 1, 1> axes are configured such that projective lines of the <1, 1, 1> axes on a plane perpendicular to the optical axis form a relative angle of 45°.

Figure 11B:
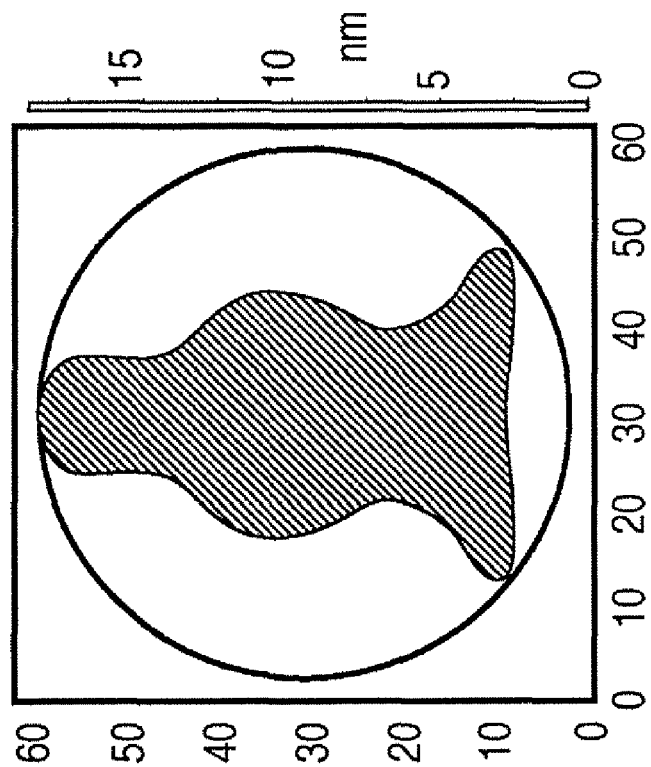
FIGS. 11A and 11B are views each showing the retardation distribution caused in the pupil by the bottom lens in Example 3.
Figure 11A:
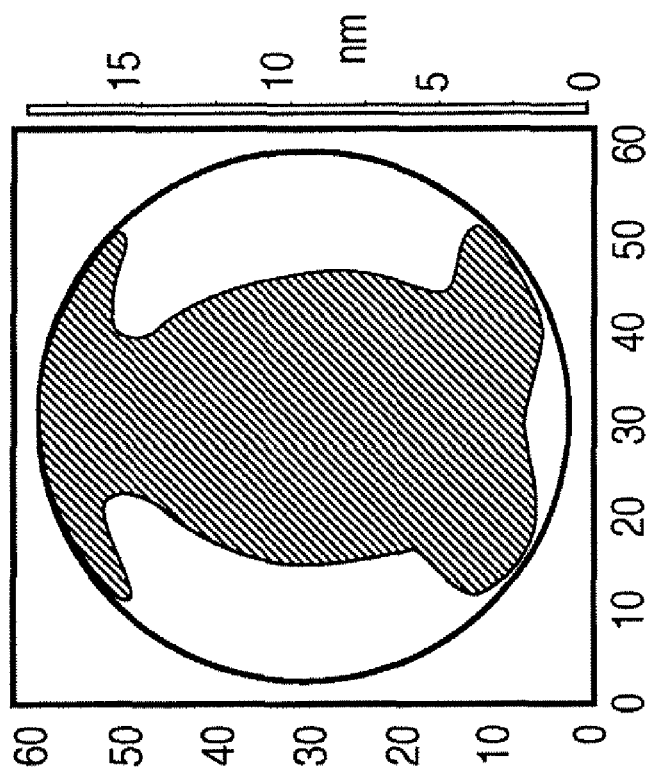

FIGS. 11A and 11B each show the retardation distribution generated by the bottom lens group 600. FIG. 11A shows the retardation distribution in the pupil at the slit center (corresponding to 4.55 mm on the IMG). FIG. 11B shows the retardation distribution in the pupil at the slit end (corresponding to 16.4375 mm on the IMG). The retardation RMS in the pupil at the slit center is corrected to 37.2 m$\lambda$, and the retardation RMS in the pupil at the slit end is corrected to 38.6 m$\lambda$. As obvious from FIGS. 11A and 11B, the tendencies of the retardation distributions between image heights are the same. The uniformity between image heights according to the above definition is corrected to 3.3 m$\lambda$.

According to our study, if R/d which is the ratio between a curvature radius R (mm) of the R1 surface, that is, the surface of the bottom lens group which is located on the first object side, and a center thickness d (mm) exceeds ½, the retardation uniformity between image heights can be corrected to 10 m$\lambda$ or less. If R/d increases too much, the lens diameter of the projection system becomes excessively large. Therefore, R/d<3.0 is preferable. That is, R/d satisfies 3.0>R/d>1.2. The retardation uniformity can be corrected more preferably as follows. Increasing the ratio R/d between the curvature radius R (mm) of the R1 surface of the bottom lens group and the center thickness d (mm) beyond 1.6 can correct the retardation uniformity between image heights to 5 m$\lambda$ or less.

In each of Examples 1 to 3, LuAG lenses each having a refractive index of 2.1 are used as lenses constituting a bottom lens group. However, the effects of the present invention can be expected by using any bottom lens group made of an isotropic crystal material having a refractive index of 1.6 or more and having a positive focal length. In order to increase the NA of the projection optical system, an isotropic crystal material having a refractive index of 2.0 or more is preferably used. This embodiment uses one type of glass material. Even if a plurality of types of glass materials are used, the effects of the present invention do not wear off. This embodiment uses, as a bottom lens group, a cemented lens obtained by cementing a plurality of lenses made of an isotropic crystal material having a refractive index of 1.6 or more. However, the bottom lens group to be used may be a single lens made of an isotropic crystal material having a refractive index of 1.6 or more.

In Examples 1 to 3, the bottom lens group is a cemented lens obtained by cementing four lenses made of an isotropic crystal material. However, the bottom lens group may be a cemented lens obtained by cementing four lenses or more made of an isotropic crystal material. In this case, it is preferable that the <1, 1, 1> crystal axes of at least two lenses be oriented in the direction of an optical axis and the <1, 0, 0> crystal axes of at least two lenses be oriented in the direction of an optical axis.

Embodiment of Exposure Apparatus

Figure 12:
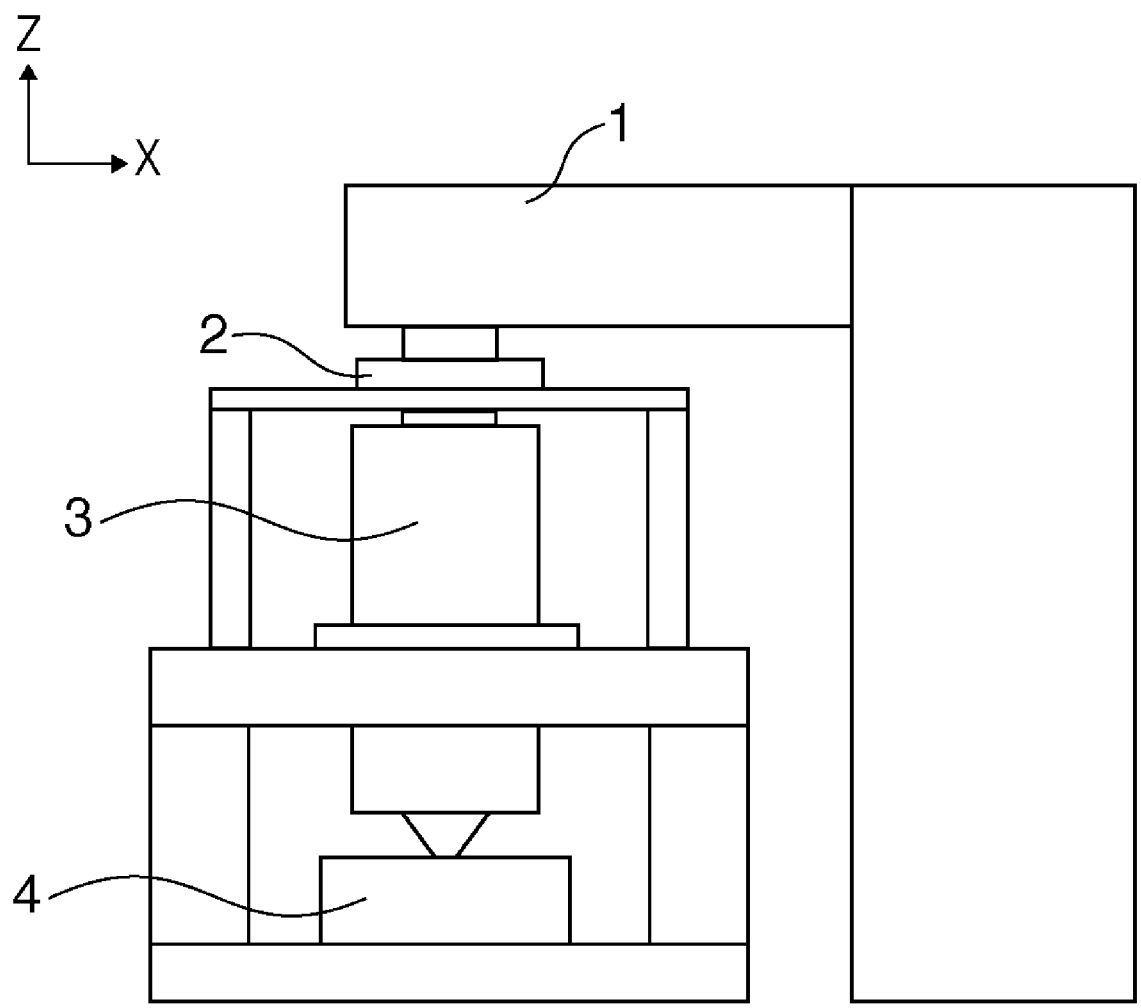
FIG. 12 is a view for explaining an exposure apparatus.

An exemplary exposure apparatus to which the above projection optical system is applied will be described below. As shown in FIG. 12, the exposure apparatus has an illumination device 1, a reticle stage 2 which mounts a reticle as an original, a projection optical system 3, and a wafer stage 4 which mounts a wafer as a substrate. The exposure apparatus projects and transfers by exposure a circuit pattern formed on a reticle onto a wafer, and may be of the step & repeat projection exposure scheme or the step & scan projection exposure scheme.

The illumination device 1 illuminates a reticle on which a circuit pattern is formed, and has a light source unit and illumination optical system. The light source unit uses, for example, a laser as a light source. The laser can be, for example, an ArF excimer laser with a wavelength of about 193 nm, a KrF excimer laser with a wavelength of about 248 nm, or an $F_2$ excimer laser with a wavelength of about 153 nm. However, the type of laser is not particularly limited to an excimer laser and may be, for example, a YAG laser, and the number of lasers is not particularly limited either. When a laser is used as the light source, an optical system for shaping a parallel light beam from the laser beam source into a desired beam shape, and an optical system for converting a coherent laser beam into an incoherent one are preferably used. Also, the light source which can be used for the light source unit is not particularly limited to a laser, and one or a plurality of mercury lamps or xenon lamps can be used.

The illumination optical system is an optical system which illuminates an original and includes, for example, a lens, mirror, light integrator, and stop. The projection optical system 3 can be, for example, an optical system having a plurality of lens elements alone, a catadioptric optical system, an optical system having a plurality of lens elements and at least one diffraction optical element such as a kinoform, or an all-mirror type optical system.

The reticle stage 2 and the wafer stage 4 can move by, for example, a linear motor. In the step & scan projection exposure scheme, the stages 2 and 4 move synchronously. An actuator is separately provided to at least one of the wafer stage 4 and the reticle stage 2 to align the reticle pattern onto the water.

The above-described exposure apparatus can be used to manufacture micropatterned devices, for example, a semiconductor device such as a semiconductor integrated circuit, a micromachine, and a thin-film magnetic head.

A method of manufacturing a device using the above-described exposure apparatus will be exemplified next.

Devices (e.g., a semiconductor integrated circuit device and liquid crystal display device) are manufactured by an exposing step of transferring by exposure a pattern onto a substrate using the exposure apparatus according to the above-described embodiment, a developing step of developing the substrate exposed in the exposing step, and other known steps (e.g., etching, resist removal, dicing, bonding, and packaging steps) of processing the substrate developed in the developing step.

The preferred examples of the present invention have been described above. Obviously, however, the present invention is not limited to the above embodiments and various modifications and changes can be made within the spirit and scope of the present invention. For example, the projection optical system of each embodiment described above can be applied to an exposure apparatus of the step & repeat scheme (which is called a "stepper"). In this case, exposure is performed while a reticle and a plate are at rest.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-252379, filed Sep. 27, 2007, which is hereby incorporated by reference herein in its entirety.

What is claimed is:

1. A projection optical system which includes a plurality of lens groups and projects an image of a first object onto a second object,
    wherein a bottom lens group of the plurality of lens groups which is positioned nearest to the second object comprises a cemented lens obtained by cementing not less than four lenses made of an isotropic crystal material having a refractive index of not less than 1.6 and has a positive focal length, and
    wherein a curvature radius R (mm) of a surface of the bottom lens group which is located on the first object side and a total center thickness d (mm) of the cemented lens satisfy 3.0>R/d>1.6 and d<60.

2. A system according to claim 1, wherein a <1, 1, 1> crystal axis of an isotropic crystal material for at least two lenses of lenses constituting the cemented lens is oriented in a direction of an optical axis, and a <1, 0, 0> crystal axis of an isotropic material for at least two lenses of the lenses constituting the cemented lens is oriented in the direction of the optical axis.

3. An exposure apparatus which comprises a projection optical system configured to include a plurality of lens groups and to project an image of an original onto a substrate and exposes the substrate to light via the original and the projection optical system,
    wherein a bottom lens group of the plurality of lens groups which is positioned nearest to the second object comprises a cemented lens obtained by cementing not less than four lenses made of an isotropic crystal material having a refractive index of not less than 1.6 and has a positive focal length, and
    wherein a curvature radius R (mm) of a surface of the bottom lens group which is located on the first object side and a total center thickness d (mm) of the cemented lens satisfy 3.0>R/d>1.6 and d<60.

4. An apparatus according to claim 3, wherein a gap between the bottom lens group and the substrate is filled with a liquid.

5. A method of manufacturing a device, the method comprising:
    exposing a substrate by using an exposure apparatus;
    developing the exposed substrate; and
    processing the developed substrate,
    wherein the exposure apparatus comprises a projection optical system configured to include a plurality of lens groups and to project an image of an original onto a substrate and expose the substrate to light via the original and the projection optical system,
    wherein a bottom lens group of the plurality of lens groups which is positioned nearest to the second object comprises a cemented lens obtained by cementing not less than four lenses made of an isotropic crystal material having a refractive index of not less than 1.6 and has a positive focal length, and
    wherein a curvature radius R (mm) of a surface of the bottom lens group which is located on the first object side and a total center thickness d (mm) of the cemented lens satisfy 3.0>R/d>1.6 and d<60.

* * * * *